US006615391B2

(12) United States Patent
Brown et al.

(10) Patent No.: US 6,615,391 B2
(45) Date of Patent: Sep. 2, 2003

(54) CURRENT CONTROLLED MULTI-STATE PARALLEL TEST FOR SEMICONDUCTOR DEVICE

(75) Inventors: Brian L. Brown, Allen, TX (US); Jackson Leung, Sugar Land, TX (US); Ronald J. Syzdek, Sugar Land, TX (US); Pow Cheah Chang, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/087,486

(22) Filed: Mar. 1, 2002

(65) Prior Publication Data

US 2002/0080668 A1 Jun. 27, 2002

Related U.S. Application Data

(62) Division of application No. 09/372,869, filed on Aug. 12, 1999, now Pat. No. 6,381,718.
(60) Provisional application No. 60/096,435, filed on Aug. 13, 1998.

(51) Int. Cl.$^7$ .............................................. G06F 17/50
(52) U.S. Cl. ........................................................ 716/4
(58) Field of Search .......................... 714/724, 25–46; 716/4, 5, 6; 257/303; 702/65; 365/201; 324/210, 765–769

(56) References Cited

U.S. PATENT DOCUMENTS

| 5,117,393 | A  |   | 5/1992  | Miyazawa et al. |
| 5,379,302 | A  | * | 1/1995  | Andrews ................... 371/22.3 |
| 5,475,692 | A  |   | 12/1995 | Hatano et al. |
| 6,101,618 | A  | * | 8/2000  | McClure ...................... 714/27 |
| 6,314,538 | B1 | * | 11/2001 | Ochoa et al. ............... 714/724 |

* cited by examiner

*Primary Examiner*—Vuthe Siek
*Assistant Examiner*—Calvin Lee
(74) *Attorney, Agent, or Firm*—Michael K. Skrehot; Wade James Brady, III; Frederick J. Telecky, Jr.

(57) ABSTRACT

A semiconductor memory device (300) having a parallel test circuit is disclosed. A test data path (308) receives parallel I/O line (I/O0–I/O7) values, and generates therefrom test result data values (PASS and DATA_TST). The test result data values (PASS and DATA_TST) are coupled to a gate control circuit (312). The gate control circuit (312) provides either a first logic value, a second logic value, or an intermediate logic value to an open drain output driver (314) depending upon the test result data values (PASS and DATA_TST). In response to the logic values received from the gate control circuit (312), the open drain output driver (314) drives a data output (DQ) to a first, second or intermediate logic level.

7 Claims, 6 Drawing Sheets

US 6,615,391 B2

CURRENT CONTROLLED MULTI-STATE PARALLEL TEST FOR SEMICONDUCTOR DEVICE

This is a divisional application of Ser. No. 09/372,869 filed Aug. 12, 1999, now U.S. Pat. No. 6,381,718 which is a non-provisional application claiming priority of provisional application No. 60/096,435 filed Aug. 13, 1998.

TECHNICAL FIELD

The present invention relates generally to test circuits for semiconductor devices, and more particularly to circuits that provide internal test result data on the output pins of a semiconductor device.

BACKGROUND OF THE INVENTION

Semiconductor memory devices typically include one or more memory arrays, each of which includes a large number of memory cells. In a standard mode, in response to an applied address, selected memory cells are accessed and a given operation is allowed to take place (e.g., a read, write, program or erase operation). The memory cells are usually logically arranged into input/output (I/O) groups in such a way that an applied address will access a memory cell from each I/O group. For example, a memory device may include 128 I/O groups, thus, the applied address would access one memory cell from each of 128 I/O groups. Selected of the 128 memory cells can then be output according to the data width of the memory device. That is, if the memory device has a data width of eight bits, an output data path will be provided to only eight of the 128 bits. Such an arrangement can also make use of "prefetch" architectures. In a prefetch architecture, all 128 memory cells would be accessed simultaneously, with data paths being provided sequentially according to the data width of the device. For example, in a read operation for a memory device having a 32-bit data width, data from 128 memory cells would be accessed in a single cycle, and then output, 32-bits at a time, on four consecutive clock cycles.

While semiconductor device manufacturing processes continue to improve, at the same time, dimensions continue to shrink and operating speeds continue to increase. Thus, in an attempt to create smaller and faster devices, manufacturing defects can still occur. In order to ensure that defective devices are not supplied to customers, semiconductor devices are usually tested to ensure their functionality. Many such tests involve writing data into and then reading data from, each of the memory cells within the semiconductor memory device. Due to the considerable number of memory cells within a semiconductor memory device, if such tests are undertaken using conventional access operations, a large amount of time is required to test each memory cell in the memory device.

In order to reduce the amount of time required to test a semiconductor memory device, many memory devices include "on-chip" test circuits. That is, rather than have test equipment generate all of the possible addresses and compare the resulting data with test data, circuits on the memory device itself can test memory cells, and provide data outputs reflecting the results of the test. An example of a prior art on-chip test arrangement for a semiconductor memory device is set forth in FIG. 1.

Referring now to FIG. 1, a prior art semiconductor memory device having an on-chip test circuit is designated by the general reference character 100. The memory device 100 is shown to include a corearray 102 which has a number of memory cells arranged into one or more arrays. The prior art memory device 100 of FIG. 1 is a synchronous dynamic random access memory (DRAM), and so receives conventional input signals, including a system clock signal (CLK), a row address strobe signal (RAS_), a column address strobe signal (CAS_), a write enable signal W_, and address signals (ADD). The input signals are received by a command decoder 104. The command decoder 104 generates internal control signals, including an internal row address strobe signal (INT_RAS), an internal column address strobe signal (INT_CAS), and internal address signals (INT_ADD). In addition, the command decoder 104 generates a test mode signal (TEST_MODE), an output enable signal (OE0), and an internal clock signal (INT_CLK).

According to the applied control signals, the corearray 102 provides access to selected memory cells by way of a number of data I/O lines (I/O0–I/O7). In the arrangement of FIG. 1, particular memory cells are accessed by the INT_ADD signals according to timing established by the INT_RAS and INT_CAS signals. The data I/O lines (I/O0–I/O7) are coupled to a standard data path 106 and a test data path 108. To avoid unduly cluttering the view of FIG. 1, the standard data path 106 illustrates the data path for line I/O0 only. The standard data path 106 is shown to include a data state circuit 110. The data state circuit 110 receives a standard enable signal STD_EN signal and the I/O0 line as inputs, and provides a standard data signal output DATA_STD. When the OE0 signal is high, the data state circuit 110 drives its output DATA_STD according to the I/O0 line signal. When the STD_EN signal is low, the date state driver is placed in a high impedance (hi-Z) state.

The output of the data state circuit 110 is connected to the input of a complementary metal-oxide-semiconductor (CMOS) transfer gate 112. The transfer gate 112, when enabled, provides a data input (DATA) to an output driver circuit 114. The transfer gate 112 is enabled by a READ_CLK signal, and its complement, READ_CLK_.

The output driver circuit 114 also receives a driver output enable signal (OE). When the OE signal is high, the output driver circuit 114 drives a data output (DQ) according to the value of the DATA signal. When the OE signal is low, the output driver circuit 114 is placed in a hi-Z state. The output driver 114 set forth in FIG. 1 is shown to include a CMOS driver stage that includes a p-channel MOS transistor P100 and an n-channel MOS transistor N100. The operation of the two transistors (P100 and N100) is controlled by NAND gate G100, NOR gate G102, and inverter I100. The DATA signal is received as an input to gates G100 and G102, and the OE signal is connected directly to gate G100 as a second input, and by way of inverter I100 as a second input to gate G102. In this arrangement, when the OE signal is low, the output of gate G100 is high and the output of gate G102 is low, resulting in transistors P100 and N100 being turned off. When the OE signal is high, in the event the DATA signal is high, transistor P100 is turned on, and transistor N100 is turned off. In the event the DATA signal is low, transistor P100 is turned off and transistor N100 is turned on.

The STD_EN signal, the READ_CLK and READ_CLK_ signals are provided by a control circuit 116. In a standard mode of operation (such as a read operation), the STD_EN signal is high and the READ_CLK and READ_CLK_ signals will pulse high and low, respectively. Consequently, as data is placed on the I/O0 line, the data state circuit 110 will drive its output according to the logic of line I/O0. Transfer gate 112 will be turned on, resulting in the DATA signal being generated from the logic of line I/O0. The DATA signal will then result in a DQ signal having the same logic as the DATA signal.

The STD_EN, READ_CLK and READ_CLK_ signals are generated by the control circuit 116 in response to the TEST_MODE signal, the OE0 signal, and the INT_CLK signal. The control circuit 116 is shown to include an inverter I102, a three-input AND gate G104, a two-input AND gate G106, and a two input NAND gate G108. The outputs of gates G104 and G106 provide inputs to a two-input OR gate G110. Gate G104 receives the OE0 signal and TEST_MODE signal as inputs, and in addition, receives a pass/fail indication (PASS) from the test data path 108. In a non-test operation (such as a standard read operation), the TEST_MODE signal is low, thus gate G104 provides a low output signal regardless of the state of its other inputs. The TEST_MODE signal is inverted by inverter I102 and applied as one input to gate G106. The other input to gate G106 is the OE0 signal. In this manner, in a non-test mode, gate G106 provides an output that reflects the value of OE0 signal. The output of gate G106 is the STD_EN signal.

The outputs of gates G104 and G106 are further provided as inputs to gate G110. The output of gate G110 is the OE signal. This arrangement results in the OE signal reflecting the OE0 value in a non-test mode.

The OE0 signal is also an input to gate G108. The other input to gate G108 is the INT_CLK signal. The output of gate G108 provides the READ_CLK_ signal, and is further inverted by an inverter I104 to generate the READ_CLK signal. Because the INT_CLK signal is activated (transitions high) in synchronism with the CLK signal, the READ_CLK and READ_CLK_ signals enable the transfer gate 116 in synchronism with the CLK signal (provided the OE0 signal is high).

Having described the operation of the DRAM 100 in a "standard" mode of operation, a parallel test mode of the particular DRAM 100 of FIG. 1 will be described. In the test mode, the standard data path 106 is disabled, preventing the I/O0 line data from reaching the transfer gate 112. In particular, with the TEST_MODE signal high, a low input is provided at gate G106, forcing the output of gate G106 (the STD_EN signal) to be low. The low STD_EN signal results in the data state circuit 110 being placed in the hi-Z state, essentially isolating line I/O0 from the transfer gate 112.

In contrast to the standard data path 106, in the test mode, the test data path 108 provides data to the transfer gate 112. The test data path 108 is shown to include a "compress" circuit 118 that receives all of the I/O lines (I/O0–I/O7) as inputs and provides two compare output signals, CMPB and CMPT, as outputs. The compress circuit 118 "compresses" test data by reducing the output values of lines I/O0–I/O7 into the two signals CMPB and CMPT. This is accomplished by comparing the data of lines I/O0–I/O7 to predetermined values. In particular, in the case of FIG. 1, in the event all of the lines I/O0–I/O7 are low, the CMPT signal will be high and the CMPB signal will be low. Conversely, in the event all of the lines I/O0–I/O7 are high, the CMPT signal will be low, and the CMPB signal will be high. The compress circuit 118 will also indicate if a test fail condition exists (i.e., all the I/O lines are not at the same logic value). In such a case, the CMPT and CMPB signals will both be high.

Within the test data path 108, the CMPT and CMPB signals are received by a test data state circuit 120 and a pass/fail circuit 122. Both the test data state circuit 120 and the pass/fail circuit 122 are enabled by the TEST_MODE signal. When the TEST_MODE signal is low, the test data state circuit 120 and the pass/fail circuit 122 are placed in a hi-Z state. When the TEST_MODE signal is high, the test data state circuit 120 provides a DATA_TST output signal that indicates the logic values of the I/O lines (I/O0–I/O7). In particular, if the I/O lines (I/O0–I/O7) are all high (or the test data indicates a fail condition), the DATA_TST signal will be high. When the I/O lines (I/O0–I/O7) are all low (and no test fail condition exists) the DATA_TST signal will be low.

The pass/fail circuit 122 utilizes the CMPB and CMPT signals to determine if an error condition exists on the I/O lines (I/O0–I/O7). If a pass condition exists, the CMPB or CMPT signals will be at different logic values (indicating that successful test data has been received), and the output of the pass/fail circuit 122 (a PASS signal), will be high. Conversely, when the CMPB and CMPT signals are both high (indicating test failure), the PASS signal will be low.

The DATA_TST and PASS signals are used to provide an output data signal (DQ) that reflects the test results. As shown in FIG. 1, the DATA_TST signal is provided as an input to transfer gate 112. Thus, in a test operation, the output driver 114 drives the DQ output according the logic values of all of the I/O lines (I/O0–I/O7), instead of according to the data of line I/O0. At the same time, the PASS signal is applied to the control circuit 116 and is utilized to enable the output driver 114. Accordingly, when the data test is passed (PASS is high), the output driver 114 will be enabled and the output DQ will be driven high in the event all of the I/O lines (I/O0–I/O7) were high, or low in the event all of the I/O lines (I/O0–I/O7) were low. When the data test indicates an erroneous value has been provided on one or more of the I/O lines (I/O0–I/O7) (PASS is low), the output driver 114 will be placed in a hi-Z state. As shown in FIG. 1, the PASS signal is provided as an input to gate G104 within the control circuit 116. Thus, when the PASS signal is low, the output of gate G104 is forced low. At the same time, a high TEST_MODE signal causes the output of gate G106 to be forced low. With two low inputs, the output of gate G110 (the OE signal) will be low. The low OE signal as applied to the output driver 114 will place the output driver 114 into the hi-Z state.

Referring now to FIG. 2, a timing diagram is set forth illustrating a test operation according to the DRAM 100 of FIG. 1. At time t0, the DRAM 100 is place into the test mode by a predetermined combination of RAS_, CAS_, W_, and ADD values. As a result, the TEST_MODE signal is driven high. The INT_CLK signal follows the CLK signal. The INT_RAS and INT_CAS signals remain low, as the applied RAS_ and CAS_ signals are not timing signals, but rather mode establishing signals. Because an access operation has not taken place at time t0, the OE0 and OE signals are both low. The low OE0 signal causes the READ_CLK signal to remain low. Because no test data has yet been generated, the PASS and DATA signals are both low.

At time t1, now that the DRAM 100 is in the test mode, a test row address (ADD) is applied in conjunction with a low RAS_ signal. The INT_RAS signal is driven high, resulting in selected memory cells being coupled to bit lines within the corearray 102. The data on the bit lines is then amplified.

At time t2, having successfully generated test data on the bit lines, a test column address (ADD) is applied in conjunction with a low CAS_ signal. The INT_CAS signal is driven high, resulting in selected of the bit lines being coupled to the I/O lines (I/O0–I/O7). The resulting I/O line test data are compared with predetermined data values in the compress circuit 118, and the results (the CMPB and CMPT signals) are provided to the test data state circuit 120 and pass/fail circuit 122.

At time t3, the test data state circuit 120 and pass/fail circuit 122 provide the DATA_TST and PASS values as outputs. As noted previously, the DATA_TST signal will be high or low, depending upon the values of the I/O lines (I/O0–I/O7), and the PASS signal will be high or low, depending upon whether or not the data have passed the test.

At time t4, according to the command decoder 104, the OE0 signal transitions high. This results in the OE and READ_CLK signals going high. The transfer gate 112 is enabled, and if the PASS signal is high (the I/O line data have passed the test) the DQ output will be driven according to the DATA_TST value. If the PASS signal is low the output driver 114 will be in the hi-Z state.

At time t5, a particular combination of RAS_, CAS_, W_ and ADD signals are applied to take the DRAM 100 out of the test mode and back into the standard mode.

In the manner described above, the DRAM 100 provide three DQ states to indicate test results, a high logic value for a successful read of all high values, a low logic value for a successful read of all low values, and a hi-Z state in the event the I/O line data fails the test.

A problem related to the parallel testing arrangement of FIG. 1 arises when different data transmission approaches are used. For example, certain types of system bus arrangements require "open drain" output drivers (as opposed to CMOS output driver of FIG. 1). In a system that requires open drain output drivers, rather than rely on semiconductor device output drivers that drive an output between a high logic level and a low logic level, an open drain output driver drives an output between a low logic state and a hi-Z state. A high logic state is then established by the bus, which includes a terminating resistor connected between the data output and a terminating voltage. When open drain output driver is in the hi-Z state, the terminating resistor will pull the output to the high logic level.

Because the open output drain driver provides only two states, instead of three, the parallel test circuit of the prior art in not capable of providing a signal that indicates the test data value read (i.e., high or low) as well as the test results (i.e., pass or fail). In light of the use of open drain drivers in semiconductor memory and other devices, it would be desirable to provide some way of providing test data from a semiconductor device having a open drain output driver.

SUMMARY OF THE INVENTION

According to the preferred embodiment, a semiconductor memory device includes a parallel data test circuit that generates a pair of test result values. The test result values are provided at an output of the semiconductor memory device. Rather than present the test result data by driving an output between a high voltage, a low voltage, and a high impedance (hi-Z) state, the preferred embodiment drives an output between a high impedance state, a low voltage and an intermediate level, by controlling the amount of current drawn by an open drain output driver.

DETAILED DESCRIPTION OF THE EMBODIMENTS

A preferred embodiment is described that provides a test mode operation in which the results of a parallel data test are provided by controlling the current supplied at the output of a gate control circuit. The gate control circuit drives an open drain type output circuit. In the preferred embodiment, the current is supplied at three different levels to create three current levels to the open drain type output circuit. The first current level results in the open drain output driver being placed in a high impedance (hi-Z) output state. The third current level results in the open drain output driver driving an output to a low logic voltage. The second current level results in the open drain output driver driving the output to an intermediate logic voltage.

Figure 1:
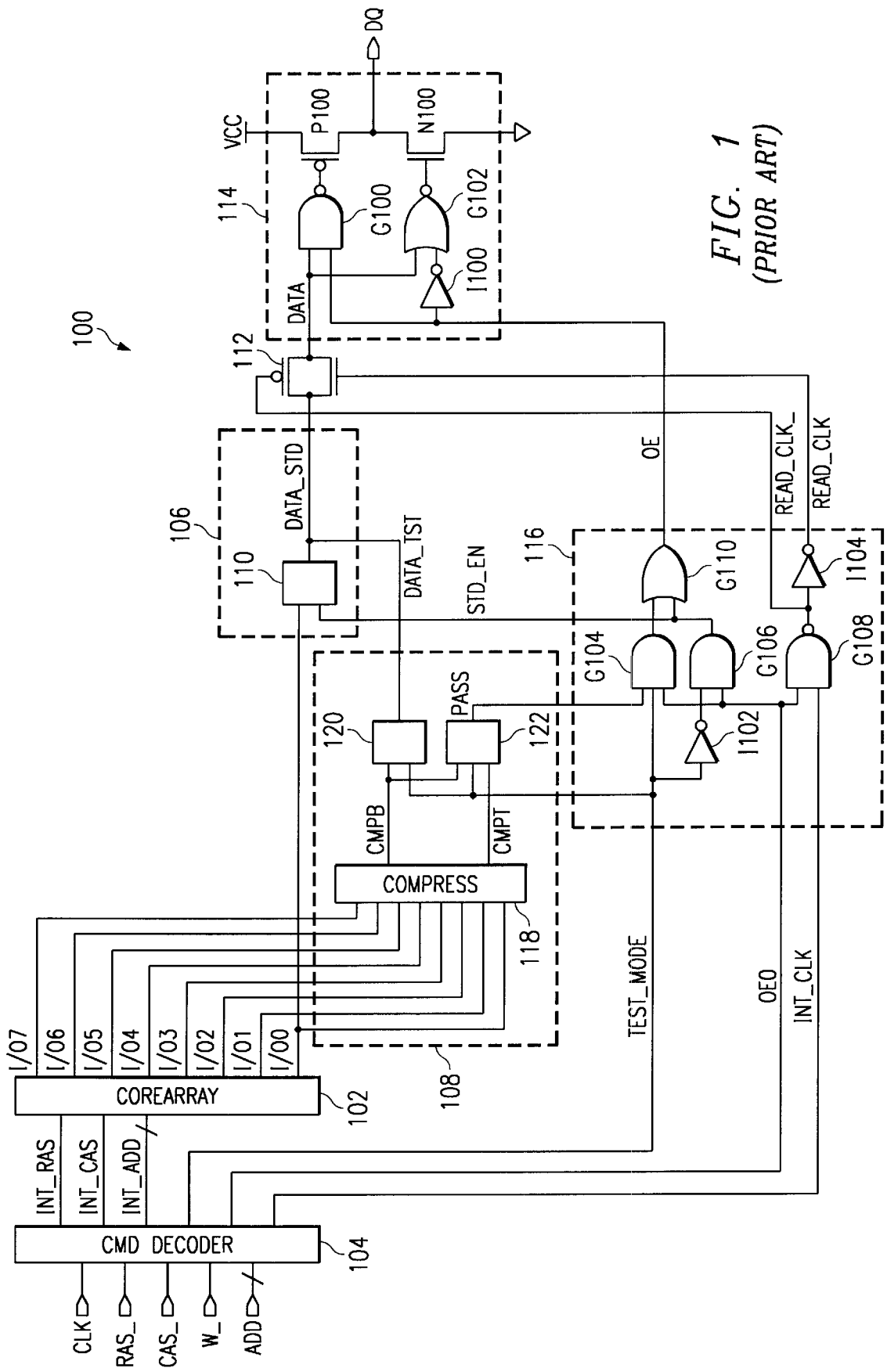
FIG. 1 is a block schematic diagram illustrating a prior art DRAM having a parallel test capability and a CMOS output driver.
Figure 2:
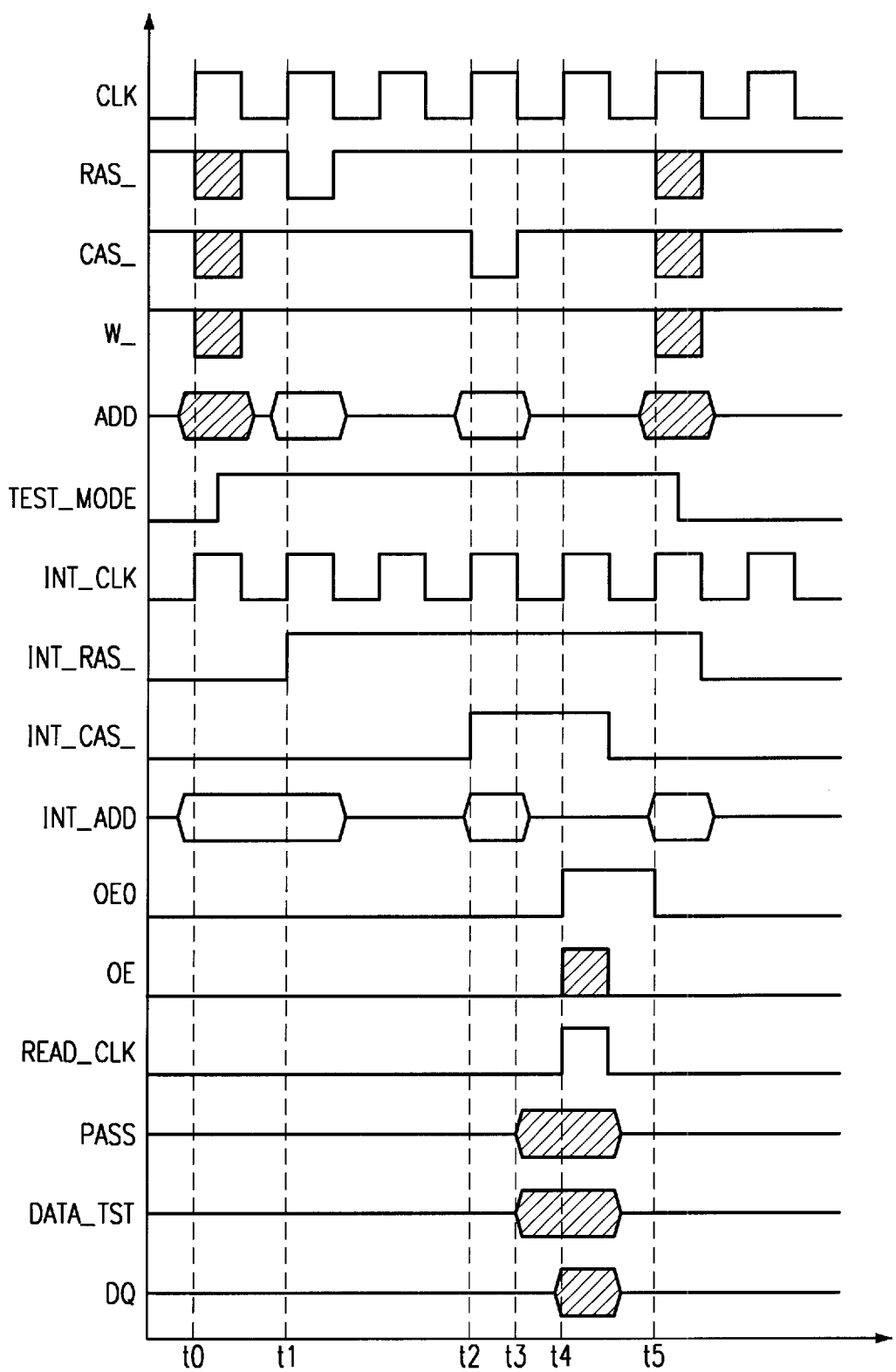
FIG. 2 is a timing diagram illustrating a test operation of the prior art DRAM set forth in FIG. 1.
Figure 3:
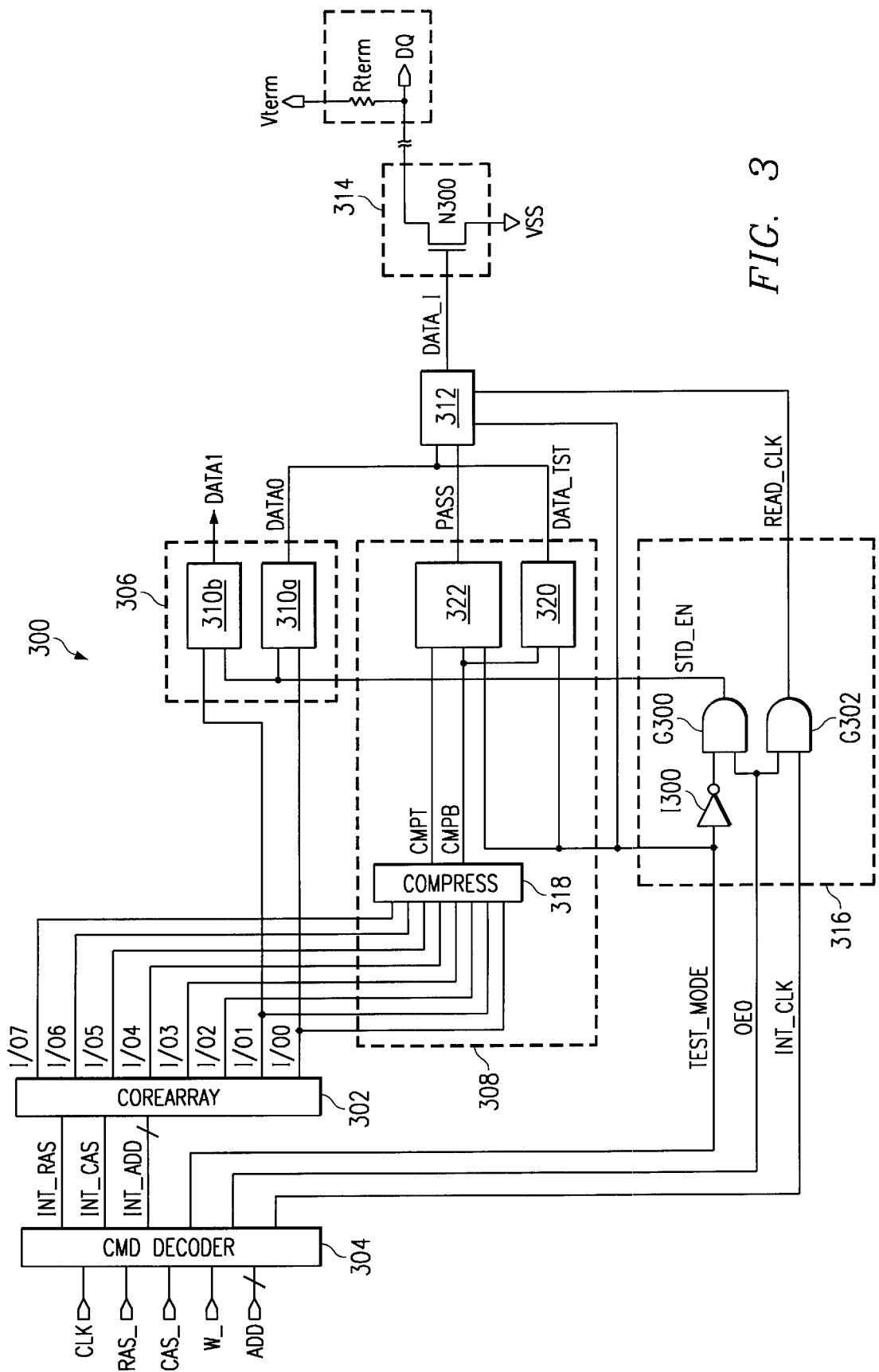
FIG. 3 is a block schematic diagram of a preferred embodiment.

Referring now to FIG. 3, the preferred embodiment is set forth in a block schematic diagram. The preferred embodiment is a dynamic random access memory (DRAM) and is designated by the general reference character 300. The preferred embodiment 302 includes a corearray 302 having a number of DRAM cells arranged into rows and columns. The DRAM cells are accessed by the application of external control signals. The preferred embodiment 300 is a synchronous DRAM (SDRAM), thus it is shown to receive the typical timing and control signals of a SDRAM, including a system clock signal (CLK), a row address strobe signal (RAS_), a column address strobe signal (CAS_), and a write enable signal W_. In addition, a memory address (ADD) is received in conjunction with the timing and control signals to select a given set of DRAM cells within the corearray 302.

The timing and control signals (CLK, RAS_, CAS_ and W_) as well as the address (ADD) are processed by a command decoder 304 to generate a number of internal timing and control signals, as well as an internal address (INT_ADD). The internal timing and control signals include an internal row address strobe signal (INT_RAS), an internal column address strobe signal (INT_CAS), a test mode signal (TEST_MODE), an output enable signal (OE0) and an internal clock signal (INT_CLK). The corearray 302 functions in a conventional fashion, coupling a row of memory cells to bit lines in response to an active (high) INT_RAS signal and an applied row address (INT_ADD). Selected of the bit lines are then coupled to data I/O lines (I/O0–I/O7) by an active INT_CAS signal and an applied column address (INT_ADD).

The data I/O lines (I/O0–I/O7) are coupled to a standard data path 306 and a test data path 308. To avoid unduly cluttering the figure, the standard data path 306 includes the data path for lines I/O0 and I/O1 only. The standard data path 306 is shown to include a first data state circuit 310a coupled to the I/O0 line and a second data state circuit 310b coupled to the I/O1 line. Each data state circuit (310a and 310b) receives its respective I/O line (I/O0 or I/O1) as one input, and a standard enable signal STD_EN signal as a second input. When the STD_EN signal is active (high), the first and second data state circuits (310a and 310b) provide first and second data signals (DATA0 and DATA1) that reflect the logic of lines I/O0 and I/O1, respectively. When the STD_EN signal is low, the first and second data state circuits (310a and 310b) are placed in a high impedance (hi-Z) state.

The DATA0 and signal is received as an input to a gate control circuit 312. The operation of the gate control circuit 312 depends upon a READ_CLK signal and the TEST_MODE signal. The output of the gate control circuit 312 is a current controlled output signal DATA_I. The operation of the gate control circuit 312 varies depending upon the value of the TEST_MODE signal. When the TEST_MODE signal is low, in response to a high READ_CLK signal pulse, the preferred embodiment 300 will drive the DATA_I signal according to the DATA0 logic value. In particular, the DATA_I signal will have a logic low establishing value (VCC) or a logic high establishing value (VSS).

The DATA_I signal is applied to an open drain output driver stage 314. The open drain output driver 314 is represented in FIG. 3 by a single n-channel MOS transistor (N300). having a drain coupled to the output DQ, a gate that receives the DATA_I signal, and a source coupled to a lower power supply voltage (VSS). Also included in FIG. 3 is a representation of the termination arrangement of the data bus. The termination arrangement includes a terminating resistor Rterm that couples the DQ output to a terminating voltage Vterm. It is understood that the terminating arrangement is external to the DRAM in the particular arrangement of FIG. 3. The open drain output driver 314 results in only two data states in a normal mode of operation. When the DATA_I signal is at the logic low establishing value (VCC), transistor N300 is turned on, and the DQ output is pulled low (to VSS). When the DATA_I signal is at the logic high establishing value (VSS), transistor N300 is turned off, and the open drain output driver 314 provides a hi-Z state, allowing the termination arrangement to draw the DQ output toward the Vterm voltage.

In a standard (non-test) read operation, the corearray 302 is accessed by the application of a conventional RAS_, CAS_ and address sequence, resulting in data being placed on lines I/O0–I/O7. The STD_EN signal is driven high, enabling the first and second data state circuits (310a and 310b) and causing the DATA0 and DATA1 values to be driven according to the logic of I/O lines I/O0 and I/O1, respectively. The DATA0 value is applied to the gate control circuit 312. Subsequently, the READ_CLK signal pulses high, causing the DATA_I signal to be driven according to the DATA0 value.

The STD_EN and READ_CLK signals are generated by a control circuit 316 in response to the TEST_MODE signal, the OE0 signal, and the INT_CLK signal. The control circuit 316 is shown to include an inverter I300, a two-input AND gate G300, and another two-input AND gate G302. The TEST_MODE signal is inverted by inverter I300 and applied as one input to gate G300. The other input to gate G300 is the OE0 signal. The resulting output of gate G300 is the STD_EN signal. Gate G302 receives the OE0 signal and INT_CLK signal as inputs, and provides the READ_CLK signal as an output. In the standard mode, the TEST_MODE signal is low; thus the STD_EN signal will pulse high in response to the OE0 signal going high.

Having described the various circuits utilized in a standard read operation, the circuits utilized for a parallel test mode will now be described. In a test mode, the standard data path 306 is disabled; preventing data from line I/O0 from reaching the gate control circuit 312. In particular, when the TEST_MODE signal goes high, gate G300 will drive the STD_EN signal low. This forces the first and second data state circuits (310a and 310b) into a hi-Z state.

In the test mode, the test data path 308 provides test data to the gate control circuit 312 instead of the I/O line (I/O0 and I/O1) output data. Within the test data path 308, lines I/O0–I/O7 are coupled to a compress circuit 318. In response to the logic of the I/O0–I/O7 logic values, the compress circuit 318 provides two compare output signals CMPB and CMPT. The CMPB and CMPT signals represent the results of a comparison of the data on the I/O lines (I/O0–I/O7) to predetermined logic values. In the preferred embodiment 300 it is assumed that the I/O lines (I/O0–I/O7) will all provide the same logic value (either high or low) in a test operation. Accordingly, for the compress circuit 318 of FIG. 3, in the event all of the lines I/O0–I/O7 are low, the CMPT signal will be high and the CMPB signal will be low. Conversely, in the event all of the lines I/O0–I/O7 are high, the CMPT signal will be low, and the CMPB signal will be high. Finally, in the event an error condition exists, resulting in a difference in the I/O line (I/O0–I/O7) values, both the CMPB and the CMPT signals will be high.

Referring back to FIG. 3, it is shown that the test data path 308 further includes a test data state circuit 320 and a pass/fail circuit 322. The test data state circuit 320 receives the CMPB signal and the TEST_MODE signal as inputs. The pass/fail circuit 322 receives the CMPT, CMPB and TEST_MODE signals as inputs. Both the test data state circuit 320 and the pass/fail circuit 322 are enabled by the TEST_MODE signal. When the TEST_MODE signal is low, indicating a non-test mode (such as a standard read operation), the test data state circuit 320 and a pass/fail circuit 322 are placed in a hi-Z state. However, when the TEST_MODE signal is high, test data is provided by the test data state circuit 320 and the pass/fail circuit 322. In particular, the test data circuit 320 will provide a DATA_TST signal that reflects the logic values of the I/O lines (I/O0–I/O7). If the I/O lines (I/O0–I/O7) are all high (or the test data indicates a fail condition), the DATA_TST signal will be high. When the I/O lines (I/O0–I/O7) are all low (and no test fail condition exists) the DATA_TST signal will be low. The pass/fail circuit 322 will provide a PASS signal that reflects whether or not the I/O line (I/O0–I/O7) data have passed the test. If the PASS signal is high, the test was successful. If the PASS signal is low, the data have failed the test.

As shown in FIG. 3, in the test mode, the DATA_TST value is provided as an input to the gate control circuit 312 in lieu of I/O line data from the first data state driver 310a. The READ_CLK signal functions in the same fashion as a conventional read operation. Therefore, in the test mode, the open drain output driver 314 will drive the DQ output according to the DATA_TST value rather than the I/O0 line data value, provided the comparison test is passed. In contrast, in the event the comparison test is failed; the open drain driver 314 will drive the DQ output so as to indicate a test fail condition. In particular, when the DATA_TST value is high, the open drain output driver 314 will be in a high impedance state, allowing the data bus to the pull the DQ signal high via the terminating resistor Rterm. If the DATA_TST value is low, the open drain output driver 314 will be turned on, driving the DQ output to the VSS value. If, however, the test operation fails, the open drain output driver 314 will only partially turn on, resulting in the DQ output being drawn to a level between the Vterm potential and the low VSS potential. In this manner, despite having an open drain output driver 314, which is conventionally only capable of two logic states, the preferred embodiment 300 provides test mode data by placing the open drain output driver 314 into one of three different states.

Figure 4:
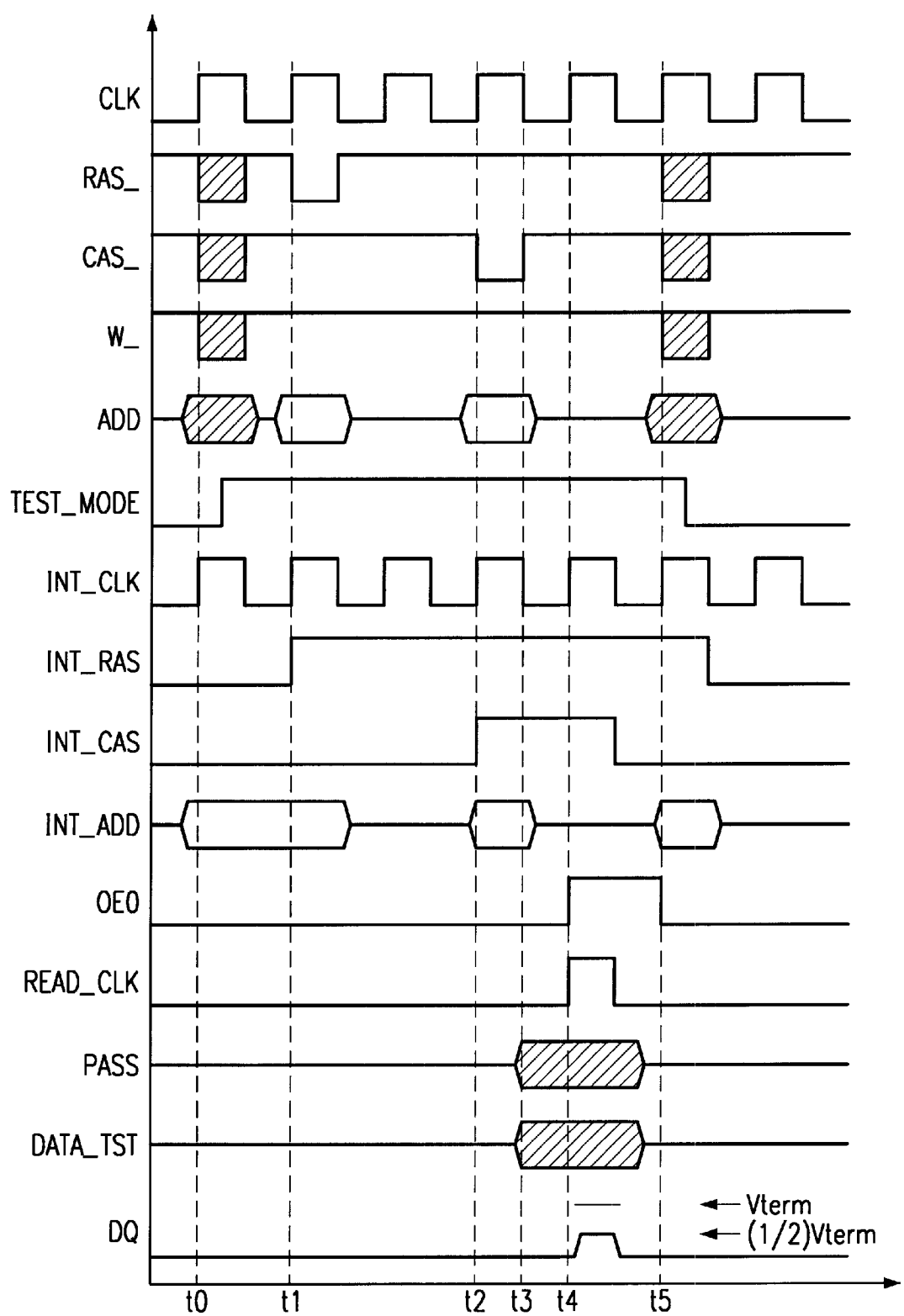
FIG. 4 is a timing diagram illustrating a test operation of the preferred embodiment.

Referring now to FIG. 4, a timing diagram is set forth illustrating a test operation of the preferred embodiment 300. The timing diagram includes the timing and control signals (CLK, RAS_, CAS_, W_ and ADD) that are applied to the preferred embodiment 300. The signals provided by the command decoder 304 (INT_RAS, INT_CAS, INT_ADD, TEST_MODE, OE0 and INT_CLK) are also set forth. Additional signals illustrated include the READ_CLK signal provided from the control circuit 316 as well as the PASS and DATA_TST signals from the test data path 308, and the DQ output signal.

At time t0, a given combination of input signals (RAS_, CAS_, W_ and ADD) is provided to the preferred embodiment 300 that places it into the test mode. Because the combination can be any of a number of combinations, the RAS_, CAS_, W_ and ADD signals are illustrated with hatching. The combination of signals is interpreted by the command decoder 304, which activates the TEST_MODE signal, forcing it high. The high TEST_MODE signal enables the test data state circuit 320 and pass/fail circuit 322. At the same general time, the high TEST_MODE signal is received by the control circuit 316, which drives the STD_EN signal low. This places the first and second data state circuits (310a and 310b) into the hi-Z state.

With the preferred embodiment 300 in the test mode, at time t1, a test row address (ADD) is received in conjunction with a low RAS_ signal. The INT_RAS signal is driven high, resulting in a row of memory cells being coupled to bit lines within the corearray 302.

At time t2, a test column address (ADD) is applied in a multiplexed address fashion in conjunction with a low CAS_signal. The INT_CAS signal is driven high, and selected bit lines, determined by the applied column address, will be coupled to the I/O lines (I/O0–I/O7). The test data on the I/O lines are compared with predetermined data values in the compress circuit 318. According to the comparison results, the compress circuit 318 drives the CMPB and CMPT signals high or low.

At time t3, the DATA_TST and PASS signals are driven according to the results of the data test operation. The DATA_TST and PASS signals are shown with hatching because the values of these particular signals will depend upon the test results.

At time t4, the command decoder 304 drives the OE0 signal high. The high OE0 signal, in combination with a high transition in the INT_CLK signal, results in the READ_CLK signal being driven high. When the READ_CLK signal is driven high, the gate control circuit 312 will cause the open drain output driver 314 to drive the DQ output according to the values of the DATA_TST and PASS signal values. FIG. 4 illustrates a test operation that fails, resulting in the PASS signal being low. Thus, regardless of the DATA_TST value, the open drain output driver 314 places the DQ value at an intermediate level. The particular intermediate level of FIG. 4 is shown to be approximately one half of the terminating voltage (Vterm).

Because the open drain output driver 314 is essentially an inverting driver (i.e., it inverts the received DATA_I value), the gate control circuit 312 of FIG. 3 provides an output value that is inverted with respect to its received input value. In particular, in the event all of the I/O lines (I/O0–I/O7) were high, and the comparison test is passed (PASS is high), a low value would be output from the gate control circuit 312. In the event all of the I/O lines (I/O0–I/O7) were low, and the comparison test passed (PASS high), a high value will be output from the gate control circuit 312. In the event the comparison test is failed (regardless of the I/O line values), an intermediate values will be output from the gate control circuit 312 that results in the intermediate DQ value.

At time t5, another combination of RAS_, CAS_, W_ and ADD signals are applied to the preferred embodiment 300 that result in the preferred embodiment 300 being taken out of the test mode and back into the standard mode. As a result, the TEST_MODE signal is driven low. The low TEST_MODE signal places the pass/fail circuit 322 and test data state circuit 320 into a hi-Z state. At the same time, the first and second data state circuit (310a and 310b) are enabled, allowing a subsequent standard read operation to place I/O line data from line I/O0 to the gate control circuit 312.

Figure 5A:
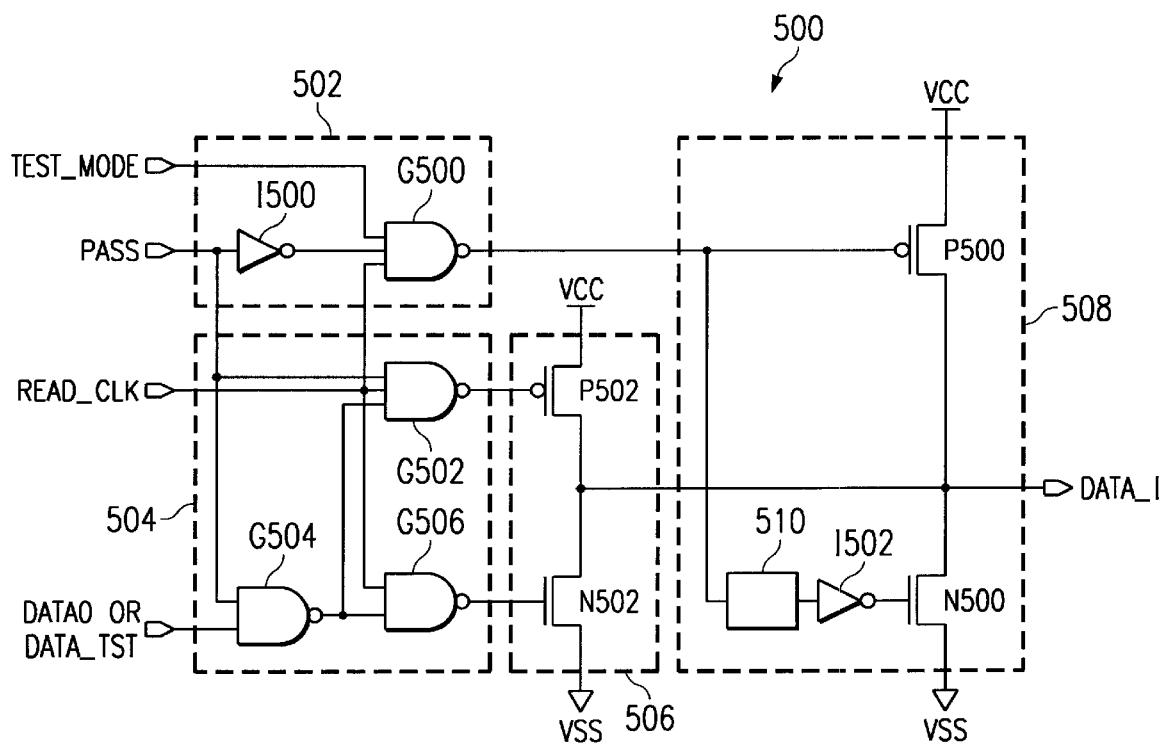
FIG. 5A is a schematic diagram illustrating a gate control circuit that may be used in the preferred embodiment.

Referring now to FIG. 5A, a gate control circuit that may used in the preferred embodiment 300 is set forth in a schematic diagram. The gate control circuit is designated by the general reference character 500, and is shown to include a test result control circuit 502, a test data value control circuit 504, a test data value driver circuit 506, and a test result driver circuit 508. The test result control circuit 502 receives the TEST_MODE signal, the READ_CLK signal, and the PASS signal. Provided the TEST_MODE signal is high, when the READ_CLK signal is pulsed high, the test result control circuit 502 drives the test result driver circuit 508 according to the PASS value. In particular, if the PASS signal is high, indicating that a compare test has been successful, the test result driver circuit 508 will be disabled, and not affect the DATA_I value. If the PASS signal is low, indicating that a compare test has failed, the test result control circuit 502 will enable the test result driver circuit 508, which will place the DATA_I value at an intermediate logic value. The data value control circuit 504 is enabled by the PASS signal. When the PASS signal is low, the data value control circuit 504 will be disabled as the READ_CLK signal pulses high, allowing the test result control circuit 502 and test result driver circuit 508 to establish the DATA_I value. When the PASS signal is high, the data value control circuit 504 will cause the data value drive circuit 506 to drive the DATA_I output between a high and low level, according to the value of the DATA_TST signal.

Another way in which to conceptualize the gate control circuit 500 is to consider it to include two driver circuits (506 and 508), one that drives the DATA_I output between a high and a low logic value, and another that drives the DATA_I output to an intermediate value.

In the particular arrangement of FIG. 5A, the test result control circuit 502 is shown to include an input inverter I500 and a three-input NAND gate G500. The inverter I500 receives the PASS signal as an input, and has an output coupled to one input of gate G500. The other inputs to gate G500 are the TEST_MODE signal and the READ_CLK signal. Accordingly, provided the TEST_MODE and READ_CLK signals are high, the output of gate G500 will be driven according to the PASS signal value.

The test result driver circuit 508 includes a p-channel MOS transistor P500 having a source-drain path coupled between the DATA_I output and a high power supply voltage VCC. The gate of transistor P500 is coupled to the output of gate G500. The test result driver circuit 508 also includes a falling edge delay circuit 510 in series with an inverter I502 and the gate of an n-channel MOS transistor N500. The falling edge delay circuit 510 delays the output of gate G500 and applies it to inverter I502. Inverter I502, in turn, drives the gate of transistor N500. Transistor N500 has a source-drain path coupled between the DATA_I output and a low power supply voltage VSS. This arrangement results in both transistors P500 and N500 being turned on when the output of gate G500 is low, and turned off when the output of gate G500 is high. It is noted that the gates of transistors P500 and N500 have non-standard gate lengths and so, will function like a voltage divider, and thereby establish an intermediate voltage (a voltage between VCC and VSS) at the DATA_I output.

The test value control circuit 504 is shown to include three NAND gates G502, G504 and G506. Gate G504 is a two-input NAND gate that receives the PASS signal and the DATA_TST signal as inputs (in a "normal" mode of operation, gate G504 receives the DATA0 signal and not the DATA_TST signal). The output of gate G504 is provided as an input to both gates G502 and G506. Gate G502 is a three-input NAND gate that receives the PASS signal and READ_CLK signals as its other inputs. Gate G506 is a two-input NAND gate that receives the READ_CLK signal as its other input. In this arrangement, provided the READ_CLK signal is low, the outputs of gates G502 and G506 will both be high. However, when the READ_CLK signal pulses high (and the PASS signal is also high) the outputs of gates G502 and G506 will both be low, if the DATA_TST signal is low, or both be high if the DATA_TST signal is high. If the PASS signal is low, when the READ_CLK signal pulses high, the output of gate G502 will be high and the output of gate G506 will be low.

The data value driver circuit 506 is shown to include a CMOS driver arrangement, including a p-channel MOS transistor P502 having a source-drain path arranged in series with an n-channel MOS transistor N502. The gate of transistor P502 is driven by the output of gate G502. The gate of transistor N502 is driven by the output of gate G506.

Figure 5B:
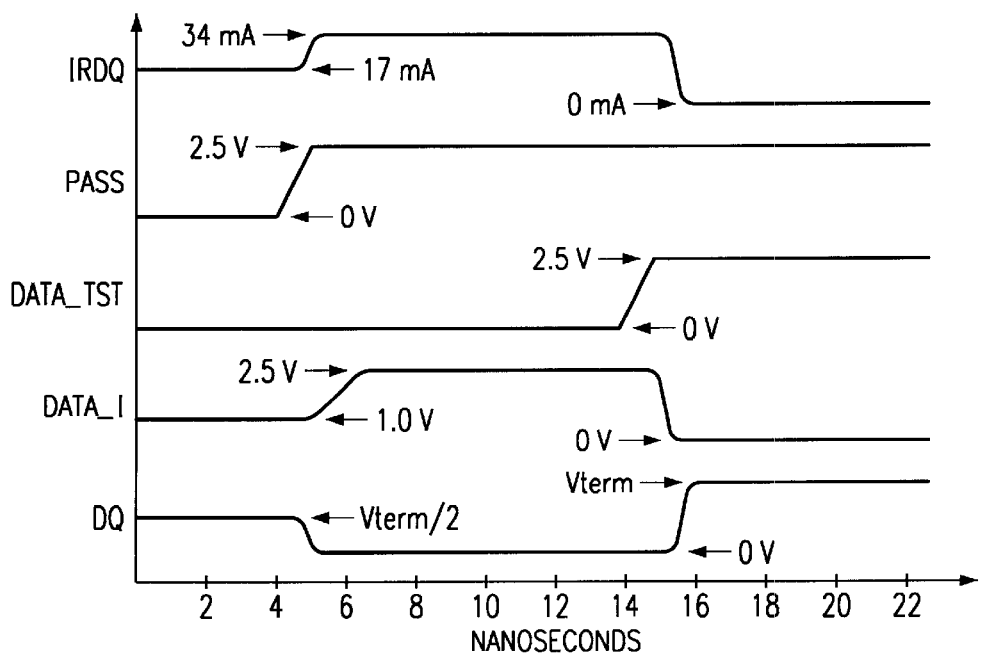
FIG. 5B is a timing diagram illustrating the operation of the gate control circuit of FIG. 5A.

Referring now to FIG. 5B a timing diagram is set forth illustrating the operation of the gate control circuit of FIG. 5A. The timing diagram sets forth the PASS, DATA_TST and DATA_I values. In addition, the DQ output value and an output current value IRDQ are also set forth. IRDQ is the amount of current that the open drain output driver will draw. For the purposes of illustration, the responses of FIG. 5B assume that the TEST_MODE and READ_CLK signals are high. It is understood that when the gate control circuit 500 is utilized in a DRAM, the READ_CLK signal would pulse high in a given output cycle.

Referring now to FIG. 5B in conjunction with FIG. 5A, at the 2 ns time mark, the PASS and DATA_TST signals are low. This indicates that a test comparison operation has failed. As a result, the output of gate G500 is driven low. This turns on transistor P500. The low output of gate G500 is also applied to inverter I502, which turns on transistor N502. In this manner, transistors P500 and N500 are turned on simultaneously, and operate as voltage dividers. At the same time, the low PASS value results in the output of gate G502 being high, which turns off transistor P502. In addition, the low DATA_TST value drives the output of gate G504 high. With gate G504 having a high output and the READ_CLK signal also assumed to be high, the output of gate G506 is low, turning off transistor N502. In this manner, transistors P502 and N502 are turned off, allowing transistor P500 and N500 to establish an intermediate voltage at the DATA_I output. As shown in FIG. 5B, the gate lengths of transistors P500 and N500 result in the DATA_I output being placed at 1.0 V, where VCC=2.5 V and VSS=0 V. The 1.0 V DATA_I value results in the open drain output driver pulling about 17 mA, which places the DQ output to an intermediate voltage of approximately Vterm/2 (where the terminating voltage is Vterm).

At the 4 ns time mark, the PASS signal transitions high, representing a passing compare test. In addition, the low DATA_TST value represents that all of the compared I/O line values were low. With the PASS signal high, the output of gate G500 is driven high, turning off transistor value P500. This same high logic value is inverted by inverter I502, causing transistor N500 to also be turned off. In this manner, the high PASS value disables the test result driver circuit 508. At the same time, with the DATA_TST signal low, the output of gate G504 continues to be high. The high PASS signal value causes the output of the gate G502 to go low, turning on transistor P502. The output of gate G506 continues to be low, and transistor N502 is turned off. Transistor P502 draws the DATA_I signal to the VCC level. As shown in FIG. 5B, the turning on of transistor P502 results in the DATA_I output being placed at 2.5 V, causing the open drain output driver to draw about 34 mA, placing the DQ output to the low voltage of approximately 0 V.

At the 14 ns time mark, the PASS signal remains high while the DATA_TST value transitions high, representing a passing compare test with all high I/O line values. With the PASS signal continuing to be high, the output of gate G500 remains high, and the test result driver circuit 508 continues to be disabled. At the same time, with the DATA_TST signal now high, the output of gate G504 will be driven low. The low gate G504 output causes the outputs of both gates G502 and G506 to be driven high. Transistor P502 is thus turned off and transistor N502 is turned on. With transistor N502 on, the DATA_I signal is driven to the VSS voltage level. As shown in FIG. 5B, transistor N502 results in the DATA_I output being placed at 0 V, causing the open drain output driver to draw about 0 mA. This arrangement allows the DQ output to be drawn to about the Vterm voltage by the terminating resistor Rterm.

Figure 6:
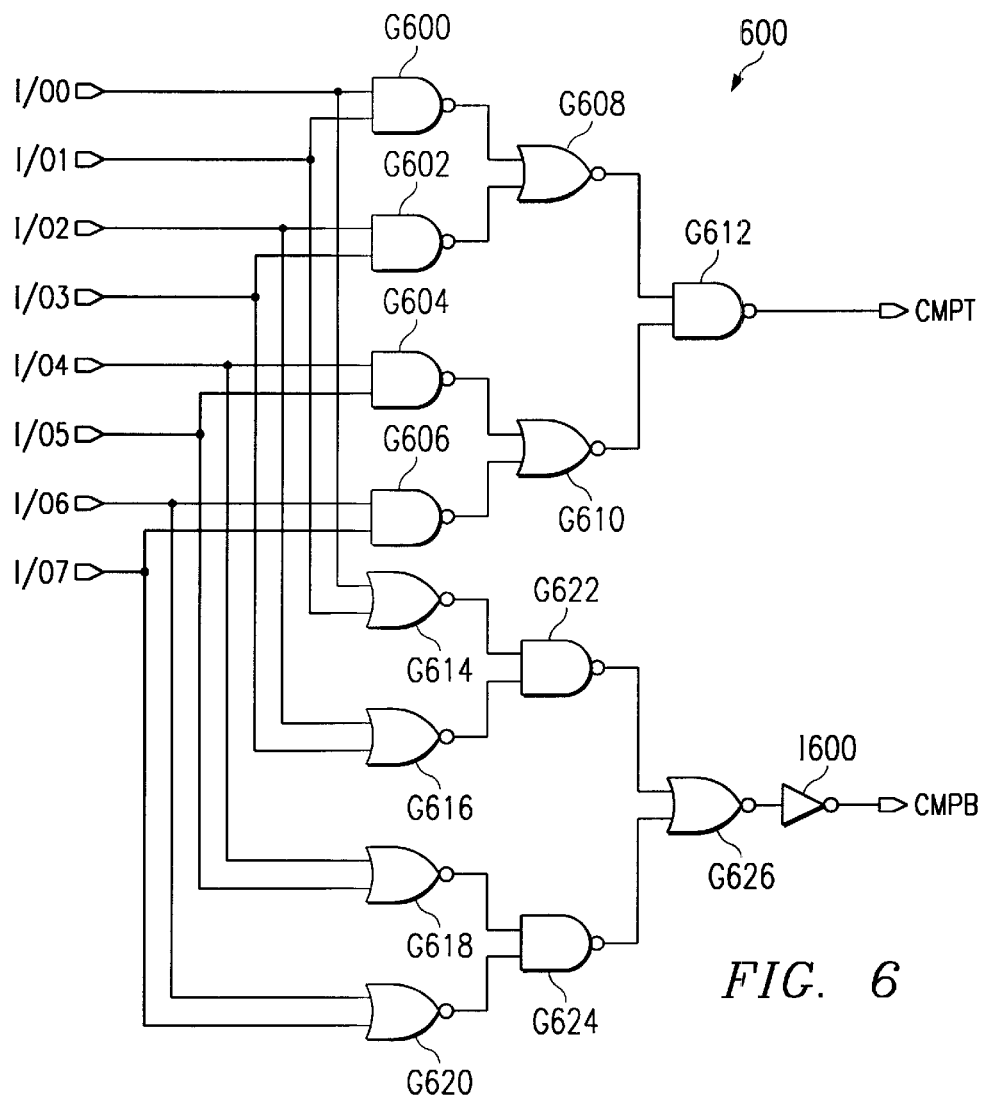
FIG. 6 is a schematic diagram of a compress circuit that may be used in the preferred embodiment.

Referring now to FIG. 6, a schematic diagram is set forth illustrating a compress circuit that may be used in the preferred embodiment 300. The compress circuit is designated by the general reference character 600, and includes a "high" compare path and a "low" compare path. The high compare path includes four two-input NAND gates (G600, G602, G604 and G606), each of which receives two different I/O lines as inputs, two two-input NOR gates (G608 an G610), and a two-input NAND gate G612. NOR gate G608 receives the outputs of NAND gates G600 and G602 as inputs. NOR gate G610 receives the outputs of NAND gates G604 and G606 as inputs. The outputs of gates G608 and G610 are provided as inputs to gate G612.

With the high compare path arrangement, if all of the I/O lines (I/O0–I/O7) are high, the outputs of gates G600, G602, G604 and G606 will all be low. With the inputs of gates G608 and G610 all low, the outputs of gates G608 and G610 will be high. With two high inputs, the output of gate G612 (and hence the CMPT signal) will be low. In this manner, a low CMPT signal indicates that all of the I/O line values are high. In contrast, in the event at least one of the I/O lines (I/O0–I/O7) is low, the output of at least one of the gates G600, G602, G604 or G606, will be high. This will cause the output of at least one of the gates G608 or G610 to be low. With at least one low input, the output of gate G612 (the CMPT signal) will be high. In this manner, a high CMPT signal indicates that at least one of the I/O lines (I/O0–I/O7) is low, meaning that a test for all high outputs has failed, or that all of the outputs are low.

The low compare path includes four two-input NOR gates (G614, G616, G618 and G620), each of which receives two different I/O lines as inputs. An NAND gate G622 receives the outputs of NOR gates G614 and G616 as inputs. Another NAND gate G624 receives the outputs of NOR gates G618 and G620 as inputs. The outputs of gates G622 and G624 are provided as inputs to a two-input NOR gate G626. The output of gate G626 is inverted by an inverter I600 to generate the CMPB signal.

With the low compare path arrangement, if all of the I/O lines (I/O0–I/O7) are low, the outputs of gates G614, G616, G618 and G620 will all be high. With the inputs of gates G622 and G624 all high, the outputs of gates G622 and G624 will be low. With two low inputs, gate G626 will be driven high. This high value will be inverted by inverter I600 to generate a low CMPB signal. In this manner, a low CMPB signal indicates that all of the I/O line values are low. In contrast, in the event at least one of the I/O lines (I/O0–I/O7) is high, the output of at least one of the gates G614, G616, G618 or G620, will be low. This will cause the output of at least one of the gates G622 or G624 to be high. With at least one high input, the output of gate G626 will be low. This low value is inverted by inverter I600 to generate a high CMPB value. In this manner, a high CMPB signal indicates that at least one of the I/O lines (I/O0–I/O7) is high, meaning that a test for all low outputs has failed, or that all of the I/O lines were high.

Figure 7:
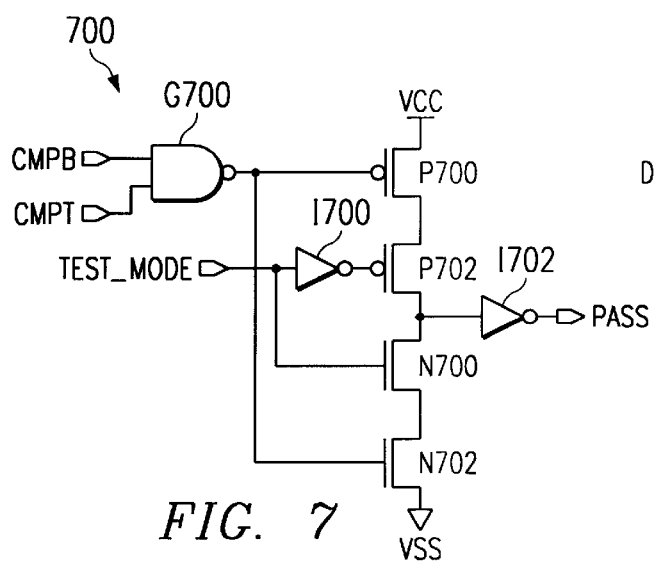
FIG. 7 is a schematic diagram of a pass/fail circuit that may be used in the preferred embodiment.

Referring now to FIG. 7, a schematic diagram is set forth for illustrating pass/fail circuit that may be used as the pass/fail circuit shown as item 322 in the preferred embodiment 300. The pass/fail circuit is designated by the general reference character 700 and is shown to include two p-channel MOS transistors (P700 and P702) arranged in series with two n-channel MOS transistors (N700 and N702). A two-input NAND gate G700 receives the CMPT and CMPB signals as inputs, and has an output coupled to the gates of transistors P700 and N702. The TEST_MODE signal is applied directly to the gate of transistor N700, and by way of an inverter I700, to the gate of transistor P702. The drain-drain connection of transistors P702 and N700 is provided as an input to an inverter I702. The output of inverter I702 is the PASS signal.

In operation, the pass/fail circuit 700 is enabled by the TEST_MODE signal being high, which turns on transistors P702 and N700. Once enabled, the PASS signal will be driven high or low depending upon the composition of the CMPB and CMPT signals. In particular, in the event the CMPB and CMPT signals are different (one high and one low) the output of gate G700 will be high, resulting in the PASS signal being high. If however, the CMPB and CMPT signals are both high, the output of gate G700 will be low, resulting in the PASS signal going low.

Figure 8:
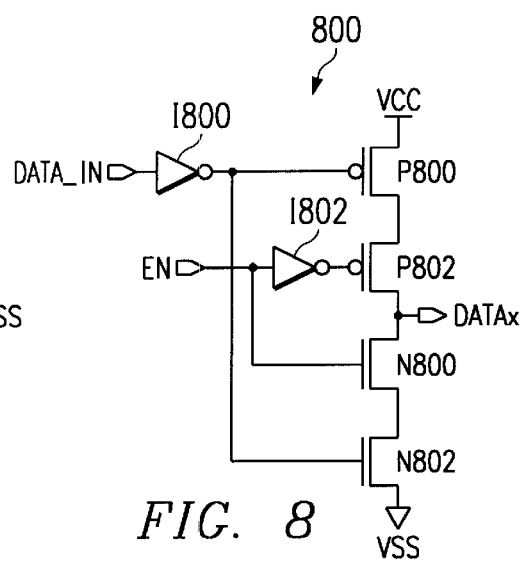
FIG. 8 is a schematic diagram of a data state driver circuit that may be used in the preferred embodiment.

FIG. 8 sets forth one example of a data state driver circuit that may be used in the preferred embodiment 300. The test data state driver circuit of FIG. 8 may be used as the first data state circuit 310a, the second data state circuit 310b, or the test data state circuit 320. Thus, the data state driver will be discussed in terms of two input signals, DATA_IN and EN, and a resulting output signal DATAx. In the case of the first data state circuit 310a, the DATA_IN input, the EN input and DATAx output can be considered to correspond to the I/O0 line, the STD_EN signal, and DATA0 signal, respectively. Similarly, for the second data state circuit 310b, the DATA_IN input, the EN input and DATAx output can be considered to correspond to the I/O1 line, the STD_EN signal, and DATA1 signal, respectively. For the test data state circuit 320, the DATA_IN input, the EN input and DATAx output can be considered to the correspond to the CMPB signal, the TEST_MODE signal, and DATA_TST signal, respectively.

In FIG. 8, the data state circuit is designated by the general reference character 800 and is shown to include two p-channel MOS transistors (P800 and P802) arranged in series with two n-channel MOS transistors (N800 and N802). An inverter I800 receives the DATA_IN input, and has an output coupled to the gates of transistors P800 and N802. The EN input is coupled directly to the gate of transistor N800, and by way of an inverter I802, to the gate of transistor P802. The drain-drain connection of transistors P802 and N800 provides the DATAx output.

In operation, the data state circuit 800 is enabled by the EN input being high, which turns on transistors P802 and N800. When enabled, the DATAx output logic level will be driven high or low depending upon the value of the DATA_IN input. For example, when the DATA_IN signal is high, transistor P800 will be turned on and transistor N802 will be turned off, driving the DATAx output high. Conversely, when the DATA_IN signal is low, transistor P800 will be turned off and transistor N802 will be turned on, driving the DATAx output low.

Although the present invention has been described in terms of detailed dynamic random access memory (DRAM) embodiment, the teachings set forth herein may be applicable to other types of semiconductor devices having a test arrangement that compresses test data, and provides the test data at an open drain, or similar type of output driver.

Accordingly, it should be understood that various changes, substitutions, and alterations could be made without departing from the spirit and scope of the invention as defined by the appended claims.

What is claimed is:

1. A method for testing a semiconductor device, comprising the steps of:
    generating a number of data signals;
    providing a test circuit to receive said signals;
    comparing said data signals to predetermined values and generating a plurality of test data values;
    coupling an output driver having an impedance path between an output node and a first logic voltage of said device, said output driver receiving an input driver signal and providing
        a low impedance path when the input driver signal is a first logic value,
        a high impedance path when the input driver signal is at a second logic value, and
        an intermediate impedance path, having an impedance that is greater than the low impedance path and less than the high impedance path when the input driver signal is at an intermediate value; and
    coupling a gate control circuit between said test circuit and said output driver, said gate control circuit receiving said plurality of test data values and driving said input driver signal to said first logic value according to a first combination of test data values, to said second logic value according to a second combination of test data values, and to said intermediate value according to a third combination of test data values.

2. The method of claim 1, wherein said step of coupling a gate control circuit comprises the steps of:
    providing said driver input signal at a control output node; and
    coupling a first driver circuit between a first supply voltage and a second supply voltage;

enabling said first driver circuit with said third combination of test data values;

dividing the voltage between said first supply voltage and said second supply voltage to generate said intermediate value at said control output node.

3. The method of claim 2, further comprising the steps of:

coupling a second driver circuit between said first supply voltage and said second supply voltage, said second driver circuit providing a low impedance path between said control output node and said first supply voltage when said second combination of test data values is received, and providing a low impedance path between said control output node and said second supply voltage when said first combination of test data values is received.

4. A method of parallel testing in a semiconductor memory device, comprising the steps of:

providing a memory cell array;

coupling a plurality of input/output (I/O) lines to said memory cell array;

coupling a test circuit to said plurality of I/O lines, said test circuit including compare logic that compares logic values on said I/O lines to predetermined logic values to generate at least a first test value and a second test value;

coupling an output driver circuit to an output node, said output driver circuit having a controllable impedance path coupled between said output node and a first logic voltage, said output driver circuit placing said controllable impedance path in a high impedance state when a first logic value is received at a driver input, and a low impedance state when a second logic value is received at said driver input, and an intermediate impedance state when an intermediate logic value is received at said driver input; and providing a gate control circuit to receive said at least first test value and said second test value, said gate control circuit driving said driver input between said first logic value, said second logic value, and said intermediate logic value according to said at least first test value and said second test value.

5. The method of claim 4, wherein said first test value indicates the logic values of said I/O lines.

6. The method of claim 4, wherein said second test value indicates if said I/O line values match said predetermined logic values.

7. The method of claim 6, wherein said gate control circuit drives said driver input to said intermediate logic value when said second test value indicates that said I/O line values do not match said predetermined logic values.

* * * * *